Figure 1:
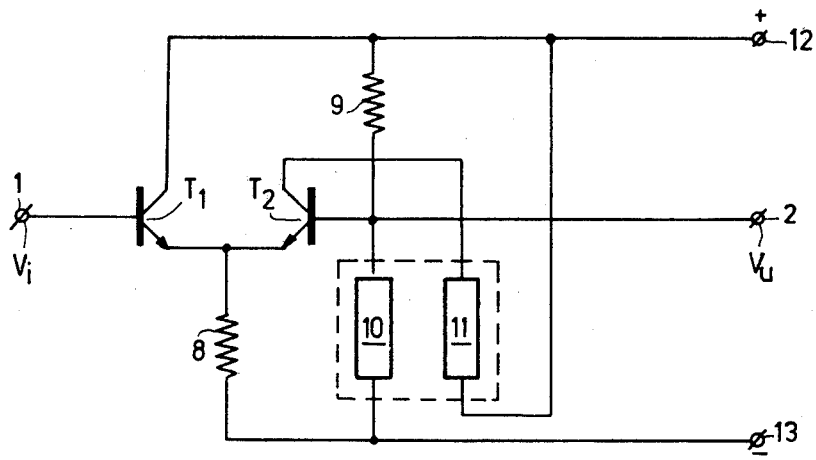

United States Patent [19]
Smeulers

[11] 3,991,327
[45] Nov. 9, 1976

[54] FILM CIRCUIT

[75] Inventor: Wouter Smeulers, Eindhoven, Netherlands

[73] Assignee: U.S. Philips Corporation, New York, N.Y.

[22] Filed: Feb. 14, 1975

[21] Appl. No.: 549,872

[30] Foreign Application Priority Data

Feb. 26, 1974 Netherlands............... 7402577

[52] U.S. Cl............................... 307/293; 307/310; 307/298
[51] Int. Cl.² ..................................... H03K 17/00
[58] Field of Search............... 307/310, 298, 293; 328/1–5; 357/4, 28

[56] References Cited
UNITED STATES PATENTS

| 3,308,271 | 3/1967 | Hilbiber............... | 357/28 |
| 3,383,614 | 5/1968 | Emmons et al........ | 357/28 |
| 3,393,870 | 7/1968 | Jeffrey et al......... | 357/28 |
| 3,531,655 | 9/1970 | Taylor................. | 307/310 |
| 3,760,200 | 9/1973 | Taniguchi............. | 307/310 |

Primary Examiner—Stanley D. Miller, Jr.
Assistant Examiner—B. P. Davis
Attorney, Agent, or Firm—Frank R. Trifari; Daniel R. McGlynn

[57] ABSTRACT

A film circuit which realizes a time constant the equivalent of a large RC time constant without the use of capacitors of comparatively large dimensions. The circuit includes a differential amplifier, to the first input of which an input signal is applied and at the second input of which an output signal is produced, in such a way that said output signal follows the d.c. level of the input signal, while rapid fluctuations of the input signal are not followed. The output signal is taken from a voltage divider which is included between the supply terminals and which comprises at least one temperature sensitive element which is in direct thermal contact with a heating resistance layer which is included in at least one of the outputs of the differential amplifier.

2 Claims, 8 Drawing Figures

FILM CIRCUIT

The invention relates to a film circuit which provides the equivalent a large RC time constant.

A film circuit consists of a substrate of an insulating material, for example glass or ceramic, on which conductor tracks are disposed using appropriate techniques, which tracs interconnect the various elements of a circuit. Said elements are integrated circuits and elements which for technical or economic reasons cannot be incorporated in an integrated circuit. A number of said elements which cannot be incorporated in the integrated circuits can be mounted on the substrate using the appropriate techniques. Resistors, inductances and capacitors can be realized within certain limits by means of said techniques. For capacitors the practical upper limit may be assumed to be appox. 10,000 pF.

Film circuits may be divided into two groups, viz. the so-called thin-film circuits and the thick-film circuits. The difference between the two said types is mainly the manner in which the various structures and conductor tracks are deposited on the substrate. In the case of thin-film circuits this is effected inter alia by evaporation or sputter techniques, while in the case of thick-film circuits the structures and conductor tracks are applied inter alia by means of various pastes, after the substrate has been partly covered in a suitable manner.

If a circuit in which a large time constant is to be realized is manufactured with conventional techniques, the circuit will mainly consist of one or more integrated circuits which, as the case may be, together with non-integrated elements made by film-techniques and a capacitor for obtaining a large time constant are disposed on a substrate which is provided with conductor tracks. The spatial dimensions of the necessary capacitor may be such that these amply exceed the dimensions of the other circuit components at least in one dimension, so that a significant advantage of the integrated circuit which is used is eliminated. For example, if such a capacitor is mounted on the substrate of a film circuit, the thickness dimension of the substrate and capacitor together will be substantially greater than that of the substrate alone.

It is an object of the invention to realize a large RC time constant in a film circuit without the use of such capacitors.

For this, the invention is characterized in that between an input terminal and an output terminal of the circuit the large RC time constant is realized, avoiding the use of capacitors of comparatively large dimensions, by the equivalent circuit of the electrical capacitance employing the heat capacity of at least a resistance layer, through which resistance layer a heating current flows, which current is determined by the difference between the input and the output voltage of the circuit and in which at least one temperature-sensitive resistance layer, which is in direct thermal contact with the heating resistance layer, determines the output voltage, with the proviso that the heating current in the event that the output voltage equals the input voltage just suffices to compensate for the loss of heat of the heating resistance layer, so that in analogy with an RC circuit at a constant input voltage a substantially equal output voltage is obtained, whilst the output voltage does not follow rapid voltage fluctuations of the input signal.

It is obvious that the resistance layers required for the circuit according to the invention can simply be deposited on the substrate by film techniques.

Although the use of the delaying properties of heated temperature-sensitive resistors is known per se, the use according to the invention is to be regarded as novel. The known circuits are mainly divided into two categories, viz.: on the one hand circuits in which a heating current is fed through the temperature-sensitive resistance, in which in contradistinction to the invention the a.c. component of the heating current causes an alternating voltage instead of a direct voltage to develop across the temperature-sensitive element, and on the other hand circuits in which use is made of an indirectly heated temperature-sensitive resistance, the delaying properties being derived from the delaying action of a heat-conducting medium between the heating element and the temperature-sensitive element, which heat-conducting element electrically behaves as a long line.

The invention is based on the insight that a heat capacity as an equivalent for an electrical capacitance can simply be used to realize an RC time constant in a film circuit.

The invention will be described with reference to the drawing, in which

Figure 1A:
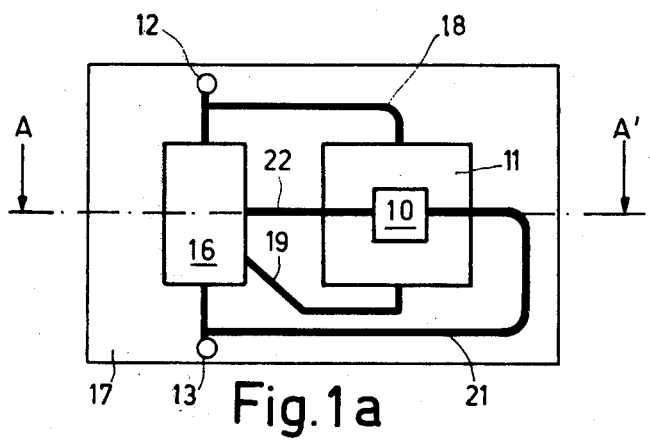
Figure 1B:
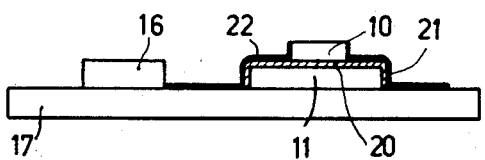
Figure 2:
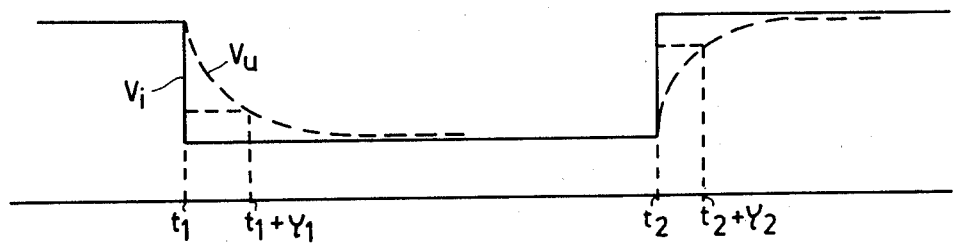
Figure 3:
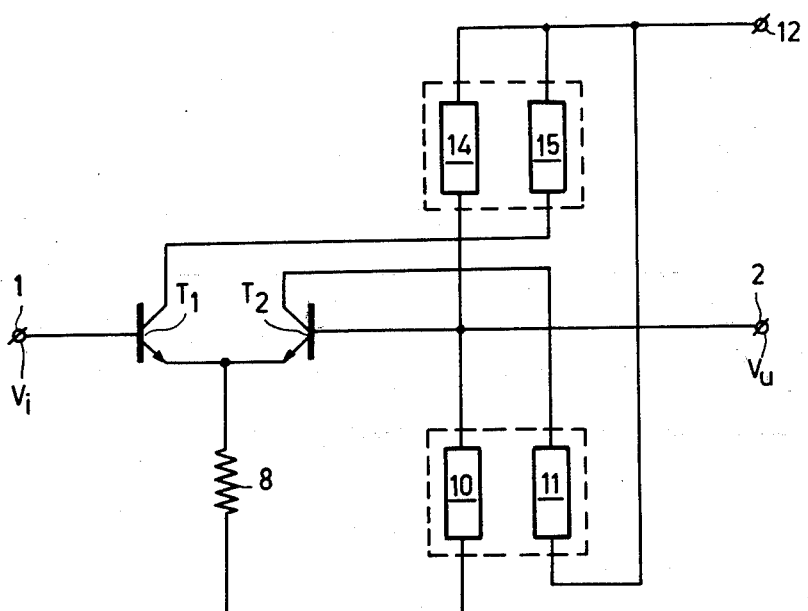
Figure 4:
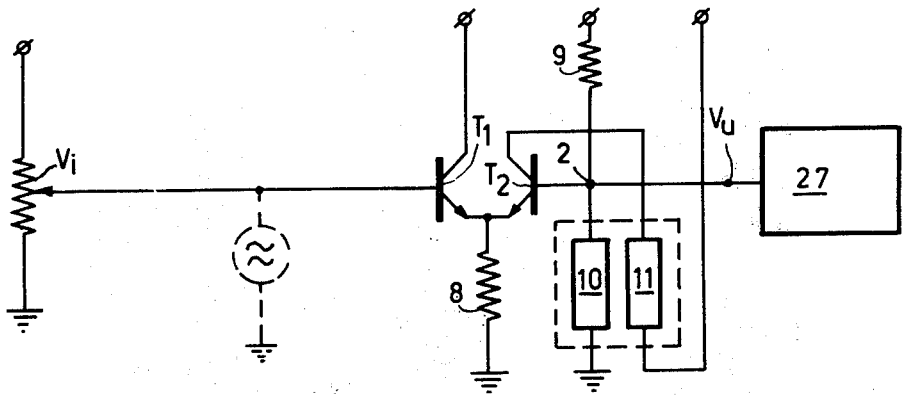
Figure 5:
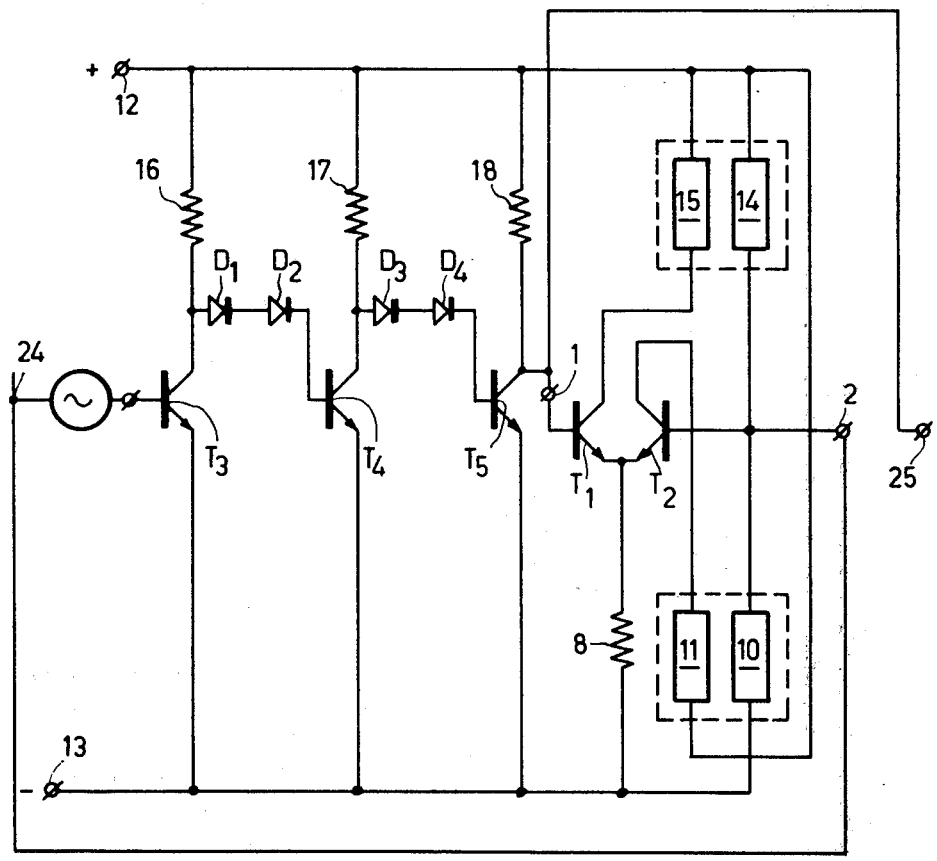
Figure 6:
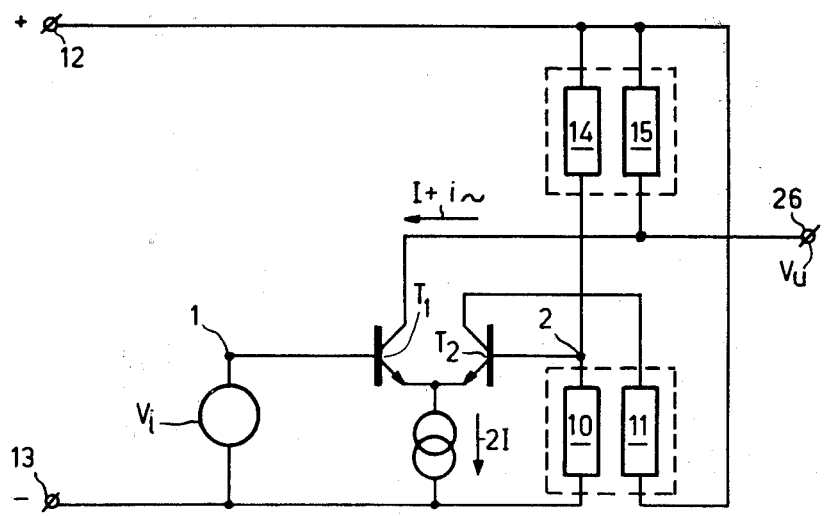

FIG. 1 shows a circuit diagram of an arrangement according to the invention,

FIG. 1a being a basic layout of the circuit of FIG. 1 in a film-technique embodiment, and FIG. 1b being a cross-section of the configuration of FIG. 1a, FIG. 2 shows the step response of the circuit of FIG. 1, FIG. 3 shows a circuit diagram of an arrangement according to the invention, in which the charge and the discharge time constant are the same, and FIGS. 4, 5 and 6 are some applications of the arrangement according to the invention.

FIG. 1 shows a first transistor $T_1$ and a second transistor $T_2$, both of the npn-type with a common-emitter circuit, which via a resistor 8 is connected to the negative supply terminal 13. The base of the transistor $T_1$ is connected to the input terminal 1 and the base of the transistor $T_2$ is connected to the output terminal 2. The collector of $T_1$ is connected to the positive supply terminal 12, whilst the collector of $T_2$ via a heating resistance layer 11 is connected to the positive supply terminal 12. The resistance layer 11 is in thermal contact with a resistance 10 with a negative temperature coefficient, to be called NTC hereinafter, in such a way that said NTC 10 is at the same temperature as the resistance layer 11. The NTC 10 connects the base of $T_2$ to the negative supply terminal 13, whilst said base via the resitance 9 is connected to the positive supply terminal, so that the resistance 9 and the NTC 10 constitute a temperature-dependent voltage divider between the supply terminals 12 and 13.

FIG. 1a shows the basic arrangement of the circuit of FIG. 1 on a substrate and by no means represents a realized embodiment to scale. The block 16 is the schematic representation of all elements of the circuit of FIG. 1 except for the NTC 10 and the resistance layer 11. Said block may include an integrated circuit of which the circuit of FIG. 1 forms part and may consist of separate elements which are disposed on the substrate 17 and which are not shown in detail. The resistance layer 11, which is disposed on the substrate 17, is connected to the positive supply terminal 12 and to the collector of the transistor $T_2$ (not further shown) in block 16 via the conductor tracks 18 and 19 respectively. On the resistance layer 11, isolated by an electrically insulating layer 20, the NTC 10 is disposed, which by the conductor tracks 21 and 22 is connected to the negative supply terminal 13 and the base of the transistor 10, not shown, respectively.

FIG. 1b shows the cross-section at the line A—A' of FIG. 1a.

The insulating layer 20 is so thin that it constitutes a negligible heat resistance, so that the resistance layer 11 and the NTC 10 may be assumed to be at substantially the same temperature.

The behavior of the circuit of FIG. 1 will be discussed with reference to FIG. 2. When at a given instant $t_1$ a negative voltage transient appears at the input, the base-emitter voltage of $T_1$ will decrease, so that the emitter current of $T_1$ and thus the voltage drop across the resistor 8 will decrease. As a result, the base-emitter voltage of $T_2$ at the instant $t_1$ will exhibit a positive transient, so that the collector current of $T_2$ also increase suddenly. The temperature of the resistance layer 11 in the collector circuit of $T_2$ gradually increases owing to the heat capacity and at the same time the temperature of NTC 10 also increases. If said NTC 10 is to follow the temperature of the heating resistance layer directly, the heat capacity of said NTC 10 should be small relative to the heat capacity of the heating resistance layer 11 and, as stated previously, the electrical insulation between the resistance layer 11 and the NTC 10 should have a low heat resistance.

The resistance of the NTC decreases at increasing temperature and owing to the voltage divider consisting of the NTC 10 and the resistor 9 the base potential of the transistor $T_2$ decreases, as a result of which the base-emitter voltage of $T_2$ decreases and thus the collector current of $T_2$. Owing to the decrease of the collector current of $T_2$ the resistance layer 11 is heated less rapidly. Said process continues until the voltage $V_u$ has reached such a value that the collector current of $T_2$ provides just sufficient power to the resistance layer 10 to compensate for the loss of heat of said resistance as a result of cooling. The circuit should be designed so that this equilibrium is attained when $V_u$ substantially equals $V_i$, which is also determined by the values of the resistors and the supply voltage. The time $\tau_1$ which elapses between the instant $t_1$ and the instant at which the output voltage has performed a part(1-1/e) of the total variation, is the RC-time constant of the circuit.

The said RC time constant determines the frequency of that input signal whose amplitude can just be followed by the output signal. If a non-negligible heat resistance were present between the heating resistance layer 11 and the NTC 10, the temperature variations of the NTC 10 would lag the temperature variations of the heating resistance layer 11. In the case of an input signal with a frequency which is substantially lower than the said frequency, the temperature of the heating resistance layer 11 will follow said input signal, while the signal at the output terminal and thus at the base of the transistor $T_2$ will follow the temperature of the NTC 10, so that an undesired phase shift exists between the input signal and the output signal. Said phase shift may become so great for certain frequencies that instabilities may result. This is because a heat resistance electrically behaves as a long line which, in contradistinction to an RC network, causes a continually increasing phase shift between input signal and output signal.

At the instant $t_2$ a positive voltage transient appears at the input, so that said process takes place in the reverse sequence, except that the decrease of the temperature of the resistance layer 11 is caused by loss of heat to the environment. As a result of this the time constant $\tau_2$ of the positive voltage-transient response is not the same as the time constant $\tau_1$ of the negative voltage-transient response. The thermal insulation of the resistance layer may be selected so that $\tau_1 = \tau_2$. If the two time constants must be equal with a high accuracy, the circuit of FIG. 1 is not satisfactory, because the cooling of the resistance layer cannot readily be predicted and controlled. The circuit of FIG. 3 does not have said drawbacks.

In the circuit of FIG. 3 the resistor 9 in the circuit of FIG. 1 has been replaced by an NTC 14, which is heated by a resistance layer 15, which connects the collector circuit of transistor $T_1$ to the positive supply terminal 12.

When a positive voltage transient occurs at terminal 1, the base-emitter voltage of $T_1$ increases and the base-emitter voltage of $T_2$ decreases. Accordingly, the collector current of $T_1$ increases and the collector current of $T_2$ decreases, so that the temperature of the resistance layer 15 rises and the temperature of the resistance layer 11 decreases. The resistance of the NTC 10 consequently increases and the resistance of the NTC 14 decreases, so that $V_u$ will increase. Conversely, in the case of a negative voltage transient at the input the reverse will happen and $V_u$ will decrease. When the various resistances are suitably selected, the obtaining time constants will be equal.

The circuit of FIG. 3, moreover, has the advantage that an alternating voltage with a frequency which is substantially higher than $1/\tau$ at the input terminals will cause a temperature rise of both NTC 10 and NTC 14, which when the circuit is correctly balanced will not affect the output voltage $V_u$, in contradistinction to the circuit of FIG. 1 where the output direct voltage decreases slightly when an alternating voltage is applied to the input.

The circuit according to the invention may be used in all circuits which employ large RC time constants and in which capacitors of large physical dimensions are not desired.

FIG. 4 schematically shows a circuit in which a control voltage Vi is remotely adjustable and which voltage via a conductor is fed to a control circuit 27. Owing to capacitive and inductive influences interference signals are produced in the line which have an adverse effect on the control means. By including a circuit according to the invention between the long line and the control circuit 27, a d.c. control voltage $V_u$ is obtained at the input of the control circuit which equals the d.c. level of $V_i$.

FIG. 5 represents an amplifier consisting of three stages with the transistors $T_3$, $T_4$ and $T_5$. The collector circuits of said transistors include the resistors 16, 17 and 18 respectively, while the collector of transistor $T_3$ via a coupling element which couples the d.c. level of the base of transistor $T_4$ to the d.c. level of the collector of transistor $T_3$, is connected to the base of transistor $T_4$. Such a coupling element may for example consist of a Zener diode or, as is shown in the Figure, of the series connection of some diodes ($D_1$ and $D_2$) in forward direction. Similarly, the collector of transistor $T_4$ is connected to the base of transistor $T_5$ via such a coupling element which consists of the series-connection of the diodes $D_3$ and $D_4$. The collector of transistor $T_5$ is connected to the output terminal 25 and via the circuit of FIG. 3 it also provides feedback to the input terminal 24. The fed-back voltage in series with an input signal is available at the base of transistor $T_3$.

Each amplifier stage of the circuit causes a 180° phase shift for low-frequency signals. When the base voltage of the transistor of the relevant amplifier stage increases, the collector current of said transistor increases and, as a result of this, the collector voltage decreases. As the voltage at terminal 2 of the circuit of FIG. 3 follows the low-frequency voltage at terminal 1 of said circuit, said low-frequency voltage is subject to full negative feedback. Said low-frequency negative feedback stabilizes the settings of the various transistors. The circuit of FIG. 3 when included in the negative-feedback path prevents feedback of high-frequency signals, thus preventing the circuit from ringing.

When the circuit of FIG. 3 is used as described in this example, it is obvious that a heat resistance between the heating resistance layer and the temperature-sensitive resistance layer is undesirable. The heat resistance gives rise to an additional phase shift in the negative-feedback loop, which at a high loop-gain may give rise to an unstable circuit arrangement.

FIG. 6 shows a third example using the circuit according to the invention. The resistor 8 in FIG. 3 has now been replaced by a current source, which draws a direct current 2I from the common emitter circuit of the transistors $T_1$ and $T_2$. Since the base potential of the transistor $T_2$ equals the d.c. component of the signal which is applied to the input terminal 1 of the circuit, the d.c. components of the collector currents of the transistors $T_1$ and $T_2$ are the same and equal I when the base currents are neglected. The a.c. componets of the collector currents are proportional to the a.c. component of the input signal and mutually in phase opposition. When the voltage which is caused across the resistor 14 by the collector current of transistor $T_1$ is applied to a terminal 25, the terminal voltage of terminal 25 consists of a d.c. component which is independent of the input signal, an a.c. component which is proportional to and in phase opposition with the a.c. component of the input signal. The circuit of FIG. 3, modified to the circuit of FIG. 6, may then selve as a peak detector.

It is obvious that for the differential amplifier constituted by the transistors $T_1$ and $T_2$ any other type of differential amplifier may be employed. Neither is the scope of the invention limited to a specific transistor type. Instead of resistance layers with a negative temperature co-efficient it is alternatively possible to employ resistance layers with a positive temperature co-efficient, to be called PTC hereinafter, with the proviso that either the temperature-sensitive resistance layer in the voltage divider is interchanged with the other element of the voltage divider, or that the associated heating resistance layers are included in the other output circuit of the differential amplifier. With respect to the circuit of FIG. 1, this yields inter alia the following possibilities, viz.;

the heating resistance layer 11 in the collector circuit of transistor $T_2$, whilst the resistance layer 11 heats a PTC which is included between the base of transistor $T_2$ and the positive supply terminal 12, the resistor 9 being included between the base of transistor $T_2$ and the negative supply terminal 13, the heating resistance layer 11 in the collector circuit of the transistor $T_1$, while the resistance layer 11 heats a PTC which is included between the base of transistor $T_2$ and the negative supply terminal 13, the resistor 9 being included in the circuit of FIG. 1.

the heating resistance layer 11 in the collector circuit of transistor $T_1$, while the resistance layer 11 heats an NTC which is included between the base of transistor $T_2$ and the positive supply terminal 12, the resistor 9 being included between the base of transistor $T_2$ and the negative supply terminal 13, the heating resistance layer 11 in the collector circuit of transistor $T_2$, while the resistance layer 11 heats the NTC10 as well as PTC, which replaces resistor 9, and the heating resistance layer 11 in the collector circuit of transistor $T_1$, while the resistance layer 11 heats and NTC which takes the place of the resistor 9, as well as a PTC which replaces the NTC10.

As regards the circuit of FIG. 3 the NTC's 14 and 10 may be replaced by PTC's, the heating resistance layers 11 and 15 being interchanged.

What is claimed is:

1. A film circuit for a time constant providing the equivalent of a large RC time constant, comprising an input terminal and an output terminal; at least one first resistance layer through which a heating current flows, said current being determined by the difference between the input and the output voltage on said input and output terminals, respectively, of said circuit; at least one temperature-sensitive resistance layer in direct thermal contact with said first resistance layer;

a differential amplifier having first and second inputs, an input signal being applied to said first input of said differential amplifier, and an output signal produced at said second input of said differential amplifier; said first resistance layer being incorporated in at least one of the two outputs of said differential amplifier, said first layer being in direct thermal contact with said temperature-sensitive resistance layer, said temperature-sensitive resistance layer forming part of a voltage divider providing said output signal which appears at said second input, said output voltage depending on the temperature of said resistance layer to be heated, said resistance layer being included in the voltage divider so that the voltage realized by the voltage divider follows the d.c. component of the input voltage;

said differential amplifier forming part of an integrated circuit disposed on an insulating substrate, on which a double layer comprising said resistance layer to be heated and said temperature-sensitive resistance layer in direct thermal contact is deposited.

2. A circuit as defined in claim 1, further comprising a control circuit, wherein said input voltage is a d.c. control voltage applied via a long line, and said output terminal is connected to the input of said control circuit.

* * * * *